(12) United States Patent
Eller

(10) Patent No.: US 6,328,806 B2
(45) Date of Patent: *Dec. 11, 2001

(54) DEVICE FOR TREATING A BAND-SHAPED SUBSTRATE WITH A GAS

(75) Inventor: Detlef Eller, Hammersbach (DE)

(73) Assignee: Applied Films GmbH & Co. KG, Alzenau (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/477,357

(22) Filed: Jan. 4, 2000

(30) Foreign Application Priority Data

Jan. 14, 1999 (DE) .............................................. 199 01 088

(51) Int. Cl.[7] .............................. B05D 3/06; C23C 16/04
(52) U.S. Cl. ............................................................ 118/718
(58) Field of Search .............................................. 118/718

(56) References Cited

U.S. PATENT DOCUMENTS

| 2,590,557 | 3/1952 | Melsheimer | 117/48 |
|---|---|---|---|
| 3,738,315 | 6/1973 | Sweitzer | 118/49.5 |
| 3,799,792 | 3/1974 | Rying | 117/43 |
| 4,265,932 | * 5/1981 | Peters et al. | 427/582 |
| 4,681,780 | 7/1987 | Kamman | 427/282 |
| 5,304,274 | 4/1994 | Crownover et al. | 156/230 |
| 5,350,598 | 9/1994 | Kleyer | 427/255.5 |
| 5,652,022 | 7/1997 | Achtner et al. | 427/251 |

FOREIGN PATENT DOCUMENTS

| 869661 | 3/1953 | (DE) . |
|---|---|---|
| 1925092 | 11/1969 | (DE) . |
| 43 11 581 A1 | 12/1994 | (DE) . |

OTHER PUBLICATIONS

Patenet abstracts of Japan 5–78818, C–1091, Jul. 30, 1993, vol. 17, No. 409.
Patent abstracts of Japan 61–261471, C–410, Apr. 17, 1987, vol. 11, No. 124.
Patent abstracts of Japan 59–89765, C–242, Sep. 12, 1984, vol. 8, No. 199.
Patent abstracts of Japan 07–207432, Aug. 8, 1995.

* cited by examiner

Primary Examiner—Jeffrie R. Lund
Assistant Examiner—Sylvia R. MacArthur
(74) Attorney, Agent, or Firm—Smith, Gambrell & Russell, LLP

(57) ABSTRACT

A treatment device (2) for treating a band-shaped substrate (1) with a gas containing a source (5) for the gas. An endless pattern band (7) that serves as the pattern carrier is guided in revolving fashion around the gas source (5) by means of several deflection rollers (8, 9, 10, 11). The pattern band (7) is formed of a screen foil that is provided with a cover (14) to produce regions on the substrate (1) that are not treated with the gas.

10 Claims, 3 Drawing Sheets

DEVICE FOR TREATING A BAND-SHAPED SUBSTRATE WITH A GAS

INTRODUCTION AND BACKGROUND

The present invention pertains to a device for treating a band-shaped substrate with a gas, wherein the device contains a source for the gas and a pattern carrier that revolves with the same circumferential speed as the substrate, with the side of the pattern carrier that faces away from the substrate being connected to the gas source, and with the pattern carrier containing openings for achieving a defined supply of the gas to the desired regions of the substrate.

Devices of the aforementioned type can serve different purposes. For example, it is possible to carry out a chemical reaction on the substrate by means of the supplied gas or to produce a coating on the substrate. Devices which operate with a gas that is usually referred to as a vapor that condensates on the substrate are broadly utilized. These devices are usually referred to as vaporization devices. Such a vaporization device is, for example, the object of DE 197 34 477. This known vaporization device serves for vapor-depositing oil onto a film to be metallized such that in an ensuing processing step no metal coating is produced within the oil-vaporized regions. In the vaporization device described in this publication, the pattern carrier is realized in the form of a screen cylinder that is driven in a revolving fashion. A stationary oil nozzle that is connected to a vaporization vessel is arranged within this screen cylinder. During the operation of the vaporization device, vapor flows from the oil nozzle against the foil to be coated, namely through the screen cylinder that is in the form of a pattern carrier with the vapor producing a pattern that corresponds to the openings in the pattern carrier on the foil.

This known treatment device, which is in the form of a vaporization device, has a relatively complicated design. Since different patterns frequently need to be applied in the coating of substrates, it is necessary to exchange the respective screen cylinder that serves as the pattern carrier when the pattern needs to be changed. This screen cylinder is a relatively thick-walled and correspondingly heavy component that is particularly complicated to install and remove when processing wide foils, as well as costly with respect to its manufacture. Since one respective pattern carrier is required for each pattern to be produced, the high manufacturing costs represent a significant limitation to the use of treatment devices with such a pattern carrier.

Therefore, an object of the present invention is to enable the production of different patterns as inexpensively as possible for use in the treatment device of the initially mentioned type.

SUMMARY OF THE INVENTION

The above and other objects of the present invention can be attained by shaping the pattern carrier in the form of an endless pattern band, and guiding the pattern carrier in revolving fashion by means of several deflection rollers.

A pattern band according to the present invention can be manufactured quite cost-efficiently, as it is formed of a thin-walled band that contains openings. Consequently, various pattern bands for producing different patterns can be provided relatively inexpensively. In addition, the utilization of band-shaped pattern carriers makes it possible to inexpensively adapt the pattern carriers to the desired pattern by producing the desired openings or sealing existing openings with a coating. The pattern band, according to the invention, is suitable for vector graphics (lines) or screen images (pixel). If the treatment device, according to the invention, is used as a coating device, it is particularly advantageous that ultra-thin pattern applications can be achieved with the gas that forms the coating medium, namely while achieving a high resolution, because the openings in the pattern band that serve for the passage of the gas can have very small dimensions. In addition, a rapid adjustment to different pattern repeat lengths and a high processing speed can be attained.

The treatment device, according to the invention, is not limited to the vapor-depositing of oil onto a band-shaped substrate. Instead of using oil in vapor form, it is, for example, also possible to apply a coating medium onto a substrate that either condenses and hardens on the substrate or already reacts with the substrate surface in the gaseous phase, e.g., in order to cause a discoloration of the substrate within certain regions. In this case, the substrate surface may be pretreated or coated such that a targeted reaction of the condensating medium and the substrate surface takes place. The substrate may consist of various types of band-shaped materials, in particular plastic foils or paper.

It is particularly advantageous if the pattern band is formed by a screen foil and provided with a cover for producing regions that are not treated with the gas on the substrate with the substrate directly adjoining the cover during the treatment. Such a pattern band can be manufactured in a particularly cost-efficient fashion. The cover may, for example, be produced by means of a coating. In this case, the screen foil can be initially covered over its entire surface, and openings can be produced at only the desired locations by means of laser light, namely by removing the coating at these locations. Another advantage of the cover can be seen in the fact that the substrate has a shorter distance from the openings in the pattern carrier. Consequently, the pressure of the emerging gas is able to equalize in the gap between the substrate and the pattern carrier that is laterally limited by the cover before the gas completely condensates or reacts on the substrate surface.

When producing a continuous strip-shaped pattern on a substrate, it is advantageous that, according to another additional development of the invention, the pattern band contains at least one opening over its entire circumference with support webs extending through this opening in order to hold together the regions of the pattern band which lie to both sides of the opening.

The support webs do not impair the application of gas within the regions covered by the support webs if they are recessed with respect to the surface of the pattern band on the side of the substrate.

When applying a separating agent onto a substrate or, for example, vapor-depositing a metal on the substrate, the gas source advantageously consists of a vaporization vessel that is heated by an electric heater.

It would be possible in principle to arrange the gas source of the pattern carrier laterally analogous to the vaporization device described in the initially mentioned DE 197 34 477, and to convey the gas underneath the pattern band by means of a line. However, the construction expenditures for the treatment device can be maintained particularly low if the pattern band extends around the gas source, in accordance with one advantageous embodiment of the invention.

Another embodiment of the invention, which is very simple with respect to construction consideration, consists of providing four deflection rollers for deflecting the pattern band. The axes of these four deflection rollers lie in the corners of an imaginary rectangle with the gas source and its outlet being arranged directly underneath the pattern band region situated between the two upper deflection rollers.

An exchange of the pattern band can be carried out very easily without having to remove other components if the substrate is linearly guided on the pattern band between two of the deflection rollers, namely such that it contacts the pattern band region extending between these two deflection rollers.

The pattern band adjoins the substrate in particularly solid fashion such that patterns with sharp contours are produced if the substrate is guided over the underside of a coating roller and the pattern band adjoins the substrate that, in turn, adjoins the coating roller between its two upper deflection rollers.

A condensation of the gas on the pattern band can be easily prevented by guiding the pattern band along a heater. In order to prevent a condensation of the gas within the remaining regions, all other components of the device that come in contact with the gas should also be heated. Since no direct contact between the substrate and the warm pattern carrier exists at the openings of the pattern carrier, the substrate remains sufficiently cold at the locations to be coated such that the gas is able to condense within these regions. In other respects, the high transport speed of the substrate, which is made possible with the device according to the invention, already suffices for preventing the heating above the condensation temperature.

The seal between the gas source and the pattern carrier may be achieved in contactless fashion, i.e., such that no wear occurs, if the gas source is sealed relative to the pattern band by means of gap locks in and opposite to the moving direction of the substrate. In such gap locks, the gas is conveyed through the surface of the pattern carrier in the moving direction of the pattern carrier similar to a pump. Gas that is still situated in the gap lock behind the gas source has sufficient time for reaching the substrate through the pattern carrier.

Even the last residues of the gas are conveyed onto the substrate if a gap lock toward the deflection roller that lies in the moving direction of the pattern band is formed in a wedge shape.

The present invention will be further understood with reference to the accompanying drawings which illustrate various embodiments.

BRIEF DESCRIPTION OF THE DRAWINGS

Several embodiments are illustrated in the figures in highly schematic fashion and are described below, wherein.

DETAILED DESCRIPTION OF THE INVENTION

Figure 1:
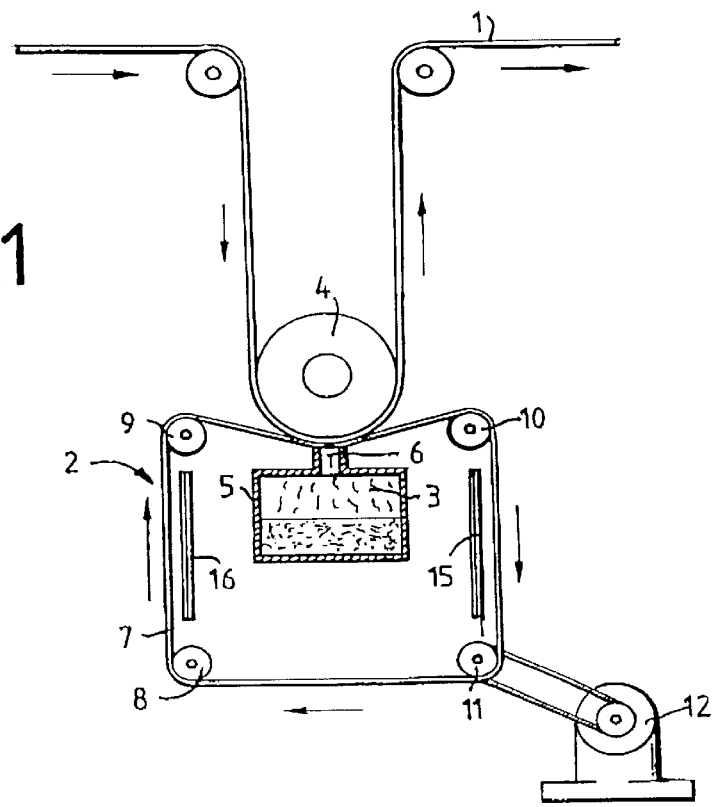
FIG. 1 is a cross-section through a first embodiment of a treatment device according to the invention.

FIG. 1 shows a substrate 1 on which a metal is to be vapor-deposited according to a desired pattern. This substrate should not be coated with the metal within certain regions in order to produce a pattern of the desired configuration. For this purpose a treatment device 2 includes a vessel containing a gas source 5 that produces a gas 3 from a medium that is frequently oil, with said gas being vapor-deposited onto the regions of the substrate 1 which are subsequently coated with a metal. The substrate 1 is guided over a coating roller 4 that deflects the substrate by 180° in this embodiment.

The treatment device 2 contains a gas source 5 that is in the form of a vaporization vessel and contains a gas outlet 6 shown here in the form of a nozzle on its upper side. This vessel contains the medium from which the gas 3 is produced. A pattern band 7 that is held on four deflection rollers 8, 9, 10, 11 is arranged around the gas source 5. The longitudinal axes of these four deflection rollers 8, 9, 10, 11 extend in the four corners of an imaginary rectangle. This figure schematically indicates that the deflection roller 11 can be driven by a motor 12. Consequently, the pattern band 7 can be driven with the same circumferential speed as the substrate 1. FIG. 1 also indicates that the coating roller 4 slightly presses the pattern band 7 downward between the deflection rollers 9, 10. This ensures that the pattern band 7 solidly adjoins the substrate 1. Two heaters 15, 16 that are arranged along the moving path of the pattern band 7 serve for heating the pattern band 7 to a temperature that lies above the condensation temperature of the gas 3. It will be clear from FIGS. 1 and 2 that the specific configuration of the rollers, heaters, vessel and nozzle can vary in number, size and orientation.

Figure 3:
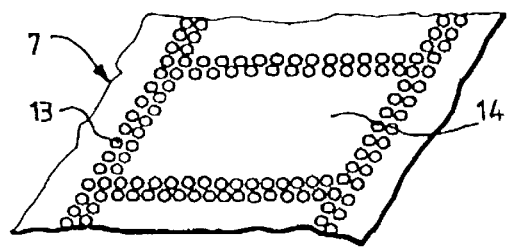
FIG. 3 is a top view of a partial region of a pattern band according to the invention.

FIG. 3 shows that the pattern band 7 can be in the form of a screen band and provided with a cover 14. This cover 14 is removed within certain regions by means of laser light to produce the desired pattern, i.e., openings 13, through which the gas 3 is able to flow, are produced at these locations.

In order to supply the gas 3 to the band-shaped substrate 1, the gas 3 produced in the gas source 5, that is in the form of a vaporization vessel, flows against the substrate 1 through the gas outlet 6 and the respective openings 13 in the revolving pattern band 7. The gas condenses on the substrate and consequently forms a separating agent layer for the ensuing metallization.

Figure 2:
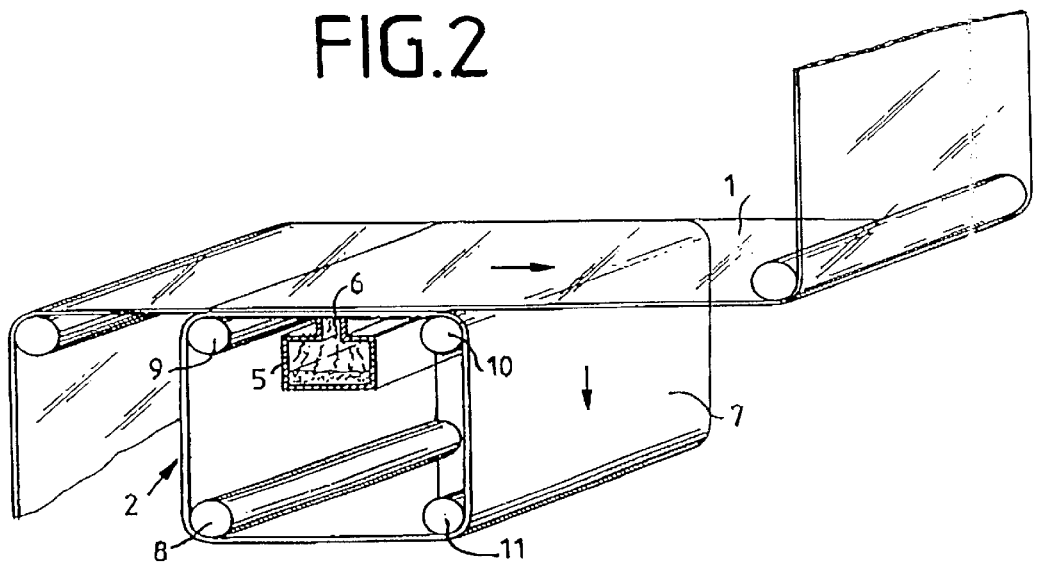
FIG. 2 is a perspective representation of a second embodiment of a treatment device according to the invention.

In the embodiment according to FIG. 2, the substrate 1 is not deflected by a coating roller within the region of the gas source 5. In this case, the substrate flatly adjoins the pattern band 7 between the deflection rollers 9 and 10. Analogous to the previously described embodiment, the gas source 5 is arranged underneath the upper region of the pattern band 7 between the deflection rollers 9 and 10. The gas 3 flows against the substrate 1 through the gas outlet 6 and through the pattern band 7.

Figure 4:
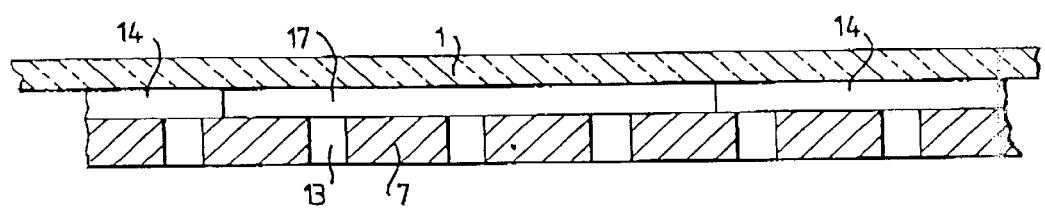
FIG. 4 is a section through a pattern band with an adjoining substrate.

FIG. 4 shows that the cover 14 on the pattern band 7 forms a precisely limited gas space 17 underneath the substrate 1. The pressure of the gas 3 emerging from the openings 13 is able to equalize in this gap space 17 such that the gas uniformly comes in contact with the substrate 1 in the region defined by the cover portions 14.

Figure 5:
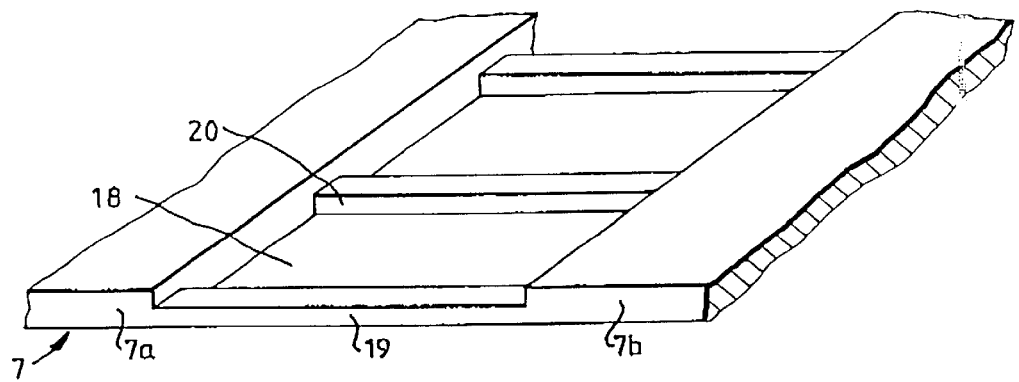
FIG. 5 is a perspective representation of a partial region of a pattern band that was modified in comparison to FIG. 4.

In the embodiment according to FIG. 5, an opening 18 extends over the entire circumference of the pattern band 7 such that one continuous strip of the substrate 1 comes in contact with the gas 3. In order to hold together the regions 7a, 7b of the pattern band 7 that are separated from one another by the opening 18, support webs 19, 20 that are recessed on the side of the substrate 1 extend transversely through the opening.

Figure 6:
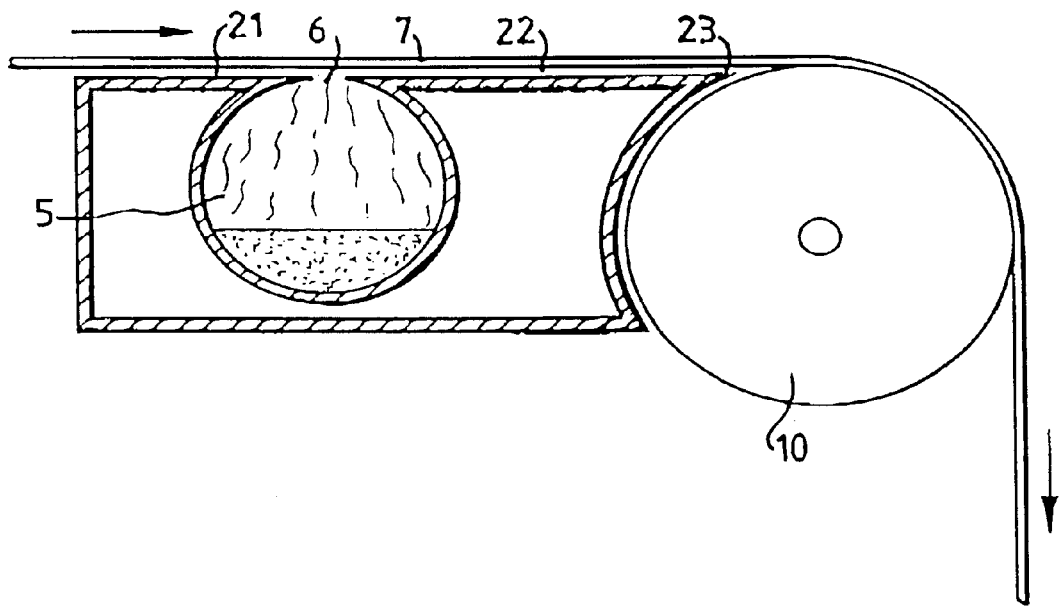
FIG. 6 is a cross section of a region of the treatment device of the invention showing the gas source, the pattern carrier and one of the deflection rollers.

FIG. 6 shows the seal between the gas outlet 6 of the gas source 5 and the pattern band 7. One can ascertain that one respective gap lock 21, 22 is formed on the inlet side as well as on the outlet side of the gas outlet 6, with the gap lock 22 on the outlet side being limited toward the deflection roller 10 by a wedge-shaped piece 23.

Further variations and modifications of the foregoing will be apparent to those skilled in the art and are intended to be encompassed by the claims appended hereto.

German priority application 199 01 088.9 is relied on and incorporated herein by reference.

I claim:

1. A device for treating a band-shaped substrate with a gas comprising
    a gas source for the gas and a pattern carrier that revolves with the same circumferential speed as the substrate, said pattern carrier having two sides, with a first side of the pattern carrier which faces away from the substrate being contacted with the gas source, and with the pattern carrier containing openings for permitting a defined supply of the gas to contact desired regions of the substrate, wherein the pattern carrier is in the form of an endless pattern band and is guided in revolving fashion by means of a plurality of deflection rollers, wherein the pattern band contains at least one opening over its entire circumference with a plurality of support webs extending through said opening in order to hold together the regions of the pattern band which lie to both sides of the opening.

2. The device according to claim 1, wherein the support webs are recessed with respect to the surface of the pattern band on the side of the substrate.

3. The device according to claim 1, wherein the gas source consists of a vaporization vessel that is heated by an electric heater.

4. The device according to claim 3, wherein the substrate is linearly guided on the pattern band between two of the deflection rollers so that the substrate is in contact with the pattern band region extending between these deflection rollers.

5. The device according to claim 1, wherein the pattern band extends around the gas source.

6. The device according to claim 5, wherein the substrate is guided over the underside of a coating roller, and the pattern band adjoins the substrate that, in turn, adjoins the coating roller between its upper deflection rollers.

7. The device according to claim 1, wherein the pattern bank is guided along a heater.

8. A device for treating a band-shaped substrate with a gas comprising:
    a gas source for the gas and a pattern carrier that revolves with the same circumferential speed as the substrate, said pattern carrier having two sides, with a first side of the pattern carrier which faces away from the substrate being contacted with the gas source, and with the pattern carrier containing openings for permitting a defined supply of the gas to contact desired regions of the substrate, wherein the pattern carrier is in the form of an endless pattern band and is guided in revolving fashion by means of a plurality of deflection rollers, wherein a total of four deflection rollers are provided for deflecting the pattern band, with the axes of said deflection rollers lying in the corners of an imaginary rectangle, and the gas source with its gas outlet is arranged directly underneath the pattern band region situated between two upper deflection rollers.

9. A device for treating a band-shaped substrate with a gas comprising:
    a gas source for the gas and a pattern carrier that revolves with the same circumferential speed as the substrate, said pattern carrier having two sides, with a first side of the pattern carrier which faces away from the substrate being contacted with the gas source, and with the pattern carrier containing openings for permitting a defined supply of the gas to contact desired regions of the substrate, wherein the pattern carrier is in the form of an endless patter band and is guided in revolving fashion by means of a plurality of deflection rollers, wherein the gas source is seated relative to the pattern band by gap locks in and opposite to the moving direction of the pattern band.

10. The device according to claim 9, wherein one gap lock is in a wedge shape toward the deflection roller that lies in the moving direction of the pattern band.

* * * * *